United States Patent [19]

Ohshima et al.

[11] Patent Number: 5,001,529
[45] Date of Patent: Mar. 19, 1991

[54] SEMICONDUCTOR DEVICE HAVING PROTECTION CIRCUIT

[75] Inventors: Shigeo Ohshima; Satoshi Yamano; Masakazu Kiryu, all of Kanagawa, Japan

[73] Assignee: Kabushiki Kaisha Toshiba, Kanagawa, Japan

[21] Appl. No.: 482,052

[22] Filed: Feb. 20, 1990

[30] Foreign Application Priority Data

Mar. 14, 1989 [JP] Japan ................................. 1-61895

[51] Int. Cl.[5] .............................................. H01L 29/78
[52] U.S. Cl. ................................ 357/23.13; 357/23.8; 307/202.1
[58] Field of Search ................. 357/23.13, 23.8, 13; 307/202.1; 361/56, 57

[56] References Cited

U.S. PATENT DOCUMENTS

| 4,131,908 | 12/1978 | Daub et al. | 361/57 |
| 4,750,078 | 6/1988 | Ganger et al. | 357/23.13 |
| 4,924,339 | 5/1990 | Atsumi et al. | 357/23.13 |
| 4,949,212 | 8/1990 | Lenz et al. | 357/23.13 |

Primary Examiner—Rolf Hille
Assistant Examiner—Tan Ho
Attorney, Agent, or Firm—Finnegan, Henderson, Farabow, Garrett and Dunner

[57] ABSTRACT

A semiconductor device is provided with a first protection path between a first terminal and an input terminal, a second protection path between a second power source terminal and the input terminal, and a third protection path between the first and the second power source terminals. Each protection path includes a first and a second P-N junction formed to be reverse biased, and is made conductive when the voltage between the corresponding two terminals exceeds a predetermined voltage so as to protect an internal circuit connected to the input terminal from an electrostatic breakdown.

6 Claims, 3 Drawing Sheets

SEMICONDUCTOR DEVICE HAVING PROTECTION CIRCUIT

BACKGROUND OF THE INVENTION

1. Field of the Invention

This invention concerns a semiconductor device. More particularly, this invention concerns a semiconductor device having a protection circuit.

2. Description of the Prior Art

Conventionally, a protection circuit has been used to protect a semiconductor device from a so-called electrostatic breakdown, namely from a breakdown due to a large voltage signal at an input terminal or an output terminal.

FIG. 1 shows a circuit diagram of a conventional protection circuit utilized in a semiconductor device. In the drawing, numeral 1 designates an input terminal. The input terminal 1 is connected to a following internal circuit. Numeral 2 designates a protection device which can be expressed as a bipolar transistor or a serial connection of two P-N junctions 11 and 12 in reversed direction. Hereafter, the protection device 2 is explained as a bipolar transistor. The collector electrode of the transistor 2 is connected to the input terminal 1, and the emitter electrode thereof is supplied with a reference voltage Vss. The base electrode of the transistor 2 is supplied with a potential Vbb of the semiconductor substrate of the semiconductor device. In the case where a P-type substrate is used, the Vbb is −2 to −3 volt, for example.

An electrostatic breakdown test is performed by applying a predetermined large voltage signal to the input terminal 1 with the supply of 0 volt as a reference voltage to the Vss terminal. In this protection circuit, when a large voltage is supplied to the input terminal 1 and the voltage between the input terminal 1 and the reference voltage terminal Vss exceeds the breakdown voltage of the P-N junction 11, the large voltage is bypassed through the bipolar transistor 2. Thus, the internal circuit can be protected from the electrostatic breakdown. The large voltage may be applied to the input terminal 1 not only during the electrostatic breakdown test but also due to the unexpected contact of a human with the semiconductor device, which may result in a discharge of static electricity.

Recently, the protection of the device from electrostatic breakdown is one of the most important factors in the reliability of the device. In the conventional semiconductor device, the protection circuit can protect the device from the electrostatic breakdown due to a large voltage between the input terminal 1 and the reference voltage terminal Vss. However, in the actual device, a large voltage may be supplied not only between the input terminal 1 and the reference voltage terminal Vss but also between the input terminal 1 and the power source voltage terminal Vdd or between the power source voltage terminal Vdd and the reference voltage terminal Vss.

Thus, it is desired that the device be protected from any electrostatic breakdown, such as that due to a large voltage between the input terminal 1 and the reference voltage terminal (Vss) (hereafter called first electrostatic breakdown), breakdown due to a large voltage between the input terminal 1 and the power source voltage terminal (Vdd) (hereafter called second electrostatic breakdown) and breakdown due to a large voltage between the reference voltage terminal Vss and the power source voltage terminal Vdd (hereafter called third electrostatic breakdown).

SUMMARY OF THE INVENTION

Therefore, an object of the present invention is to provide a protection circuit which can protect the semiconductor device from the first, the second and the third electrostatic breakdown.

Another object of the present invention is to provide a semiconductor device which has an improved pattern layout for forming the protection circuit.

To achieve these objects, this invention provides a protection circuit for a semiconductor device having a first terminal supplied with a reference voltage, a second terminal supplied with a power source voltage and an input terminal connected to an internal circuit, comprising: a first protection path connected between the input terminal and the first terminal, including a first and a second P-N junction each serially connected to be reverse biased; a second protection path connected between the input terminal and the second terminal, including a third and a fourth P-N junction each serially connected to be reverse biased; and a third protection path connected between the first and the second terminals, including a fifth and a sixth P-N junction each serially connected to be reverse biased.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings.

DETAILED DESCRIPTION OF THE INVENTION

Figure 1:
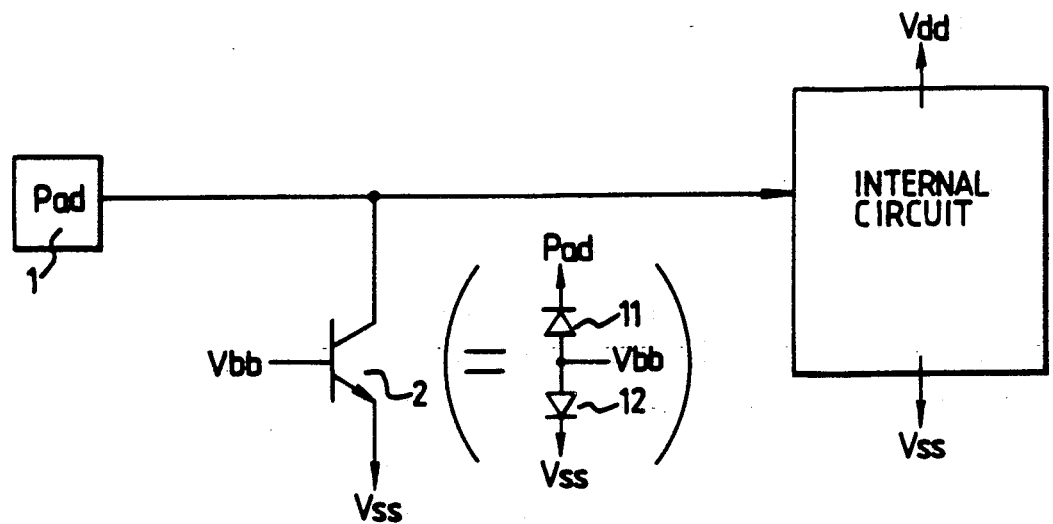
FIG. 1 is a circuit diagram of a conventional protection circuit.
Figure 2:
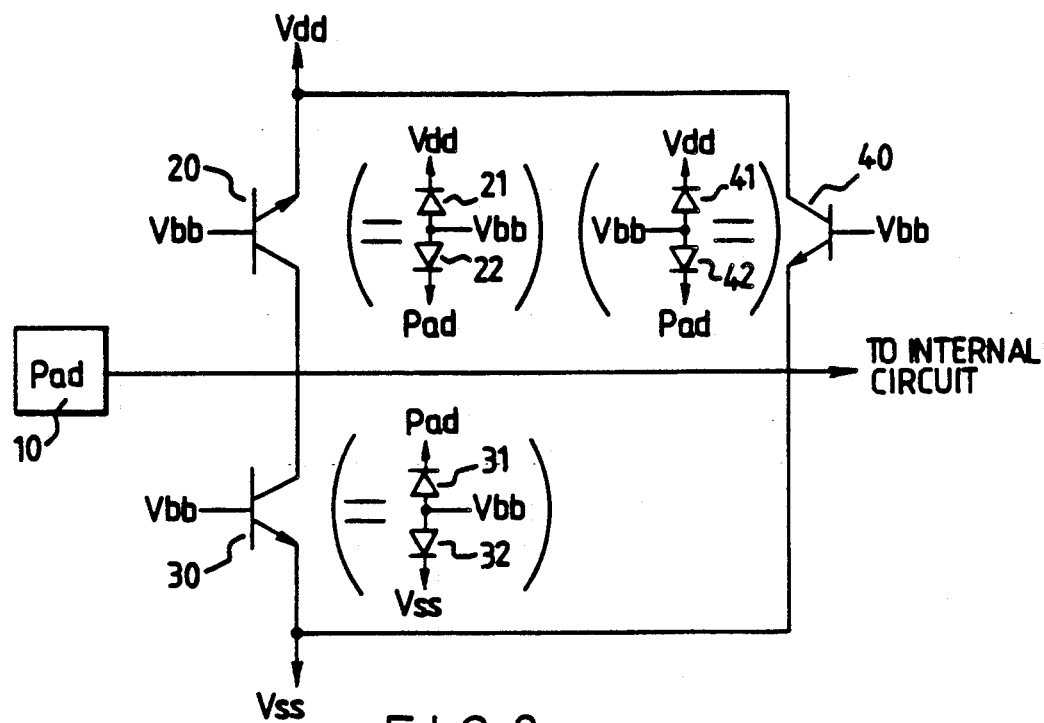
FIG. 2 is a circuit diagram of a protection circuit according to the present invention.

Referring now to the drawings, the present invention will be explained. FIG. 2 is a circuit diagram of a protection circuit according to the present invention. In this circuit, numeral 10 is an input terminal for receiving an input signal, and is connected to a following internal circuit (not shown).

In this embodiment of the invention, there is provided a first protection path formed between the input terminal and a reference voltage terminal. In this embodiment, the first protection path includes a first bipolar transistor 30 having an emitter electrode supplied with the reference voltage Vss (e.g., 0 volt), a base electrode supplied with a predetermined voltage Vbb (e.g. −2 volt) and a collector electrode connected to the input terminal 10. The predetermined voltage equal to Vbb is the substrate potential of the semiconductor device.

The first transistor 30 can also be expressed as two P-N junctions 31 and 32 serially formed in reversed direction, so they are reverse biased during normal operation of the device.

In this embodiment of the invention, there is provided a second protection path. In this embodiment, the second protection path includes a second bipolar transistor 20 having an emitter electrode supplied with a power source voltage Vdd (e.g., 5 volt), a base electrode supplied with the predetermined voltage Vbb and a collector electrode connected to the input terminal 10. Similarly, the second bipolar transistor 20 can be expressed as two P-N junctions 21 and 22 serially formed in reversed direction, so they are reverse biased during the normal operation of the device.

In this embodiment of the invention, there is provided a third protection path. In this embodiment, the third protection path includes a third bipolar transistor 40 having an emitter electrode supplied with the reference voltage Vss, a base electrode supplied with the predetermined voltage Vbb and a collector electrode supplied with the power source voltage Vdd. The third bipolar transistor 40 can be expressed as two P-N junctions 41 and 42 serially formed in reversed direction, so they are reverse biased during the normal operation of the device.

In this protection circuit, if a large positive voltage is supplied to the input terminal 10 and the voltage between the input terminal 10 and the reference voltage terminal Vss exceeds the breakdown voltage of the P-N junction 31, a protection path is formed between the input terminal 10 and the reference voltage terminal Vss and the large voltage is bypassed through the first bipolar transistor 30 to the reference voltage terminal Vss. Thus, the internal circuit can be protected from the first electrostatic breakdown due to the large voltage between the input terminal 10 and the reference voltage terminal Vss.

Furthermore, if the voltage between the input terminal 10 and the power source voltage terminal Vdd exceeds the breakdown voltage of the P-N junction 22 due to the positive large voltage, the transistor 20 becomes conductive and another protection path is formed between the input terminal 10 and the power source voltage terminal Vdd.

If a large negative voltage is supplied to the input terminal 10 and the voltage between the input terminal 10 and the power source voltage terminal Vdd exceeds the breakdown voltage of the P-N junction 21, a protection path is formed between the power source voltage terminal Vdd and the input terminal 10. Thus, the large voltage is bypassed through the protection path, and the following internal circuit can be protected from the second electrostatic breakdown due to the large voltage between the input terminal 10 and the power source voltage terminal Vdd.

If the voltage between the reference power source terminal Vss and the input terminal 10 exceeds the breakdown voltage of the P-N junction 32 formed between the emitter and the base of the first transistor 30 due to the large negative voltage, the first transistor 30 forms a protection path between the reference voltage terminal Vss and the input terminal 10. In this way, the internal circuit can be protected from both the positive and the negative voltages at the input terminal 10.

Furthermore, the following internal circuit can be protected from a large voltage between the reference voltage terminal Vss and the power source voltage terminal Vdd. Namely, if a large positive voltage is supplied to the power source voltage terminal Vdd and the voltage between the power source voltage terminal Vdd and the reference voltage terminal Vss exceeds the breakdown voltage of the P-N junction 41, a protection path is formed between the power source voltage terminal Vdd and the reference voltage terminal Vss.

Similarly, if a large negative voltage is supplied to the power source voltage terminal Vdd and the voltage between the power source voltage terminal Vdd and the reference voltage terminal Vss exceeds the breakdown voltage of the P-N junction 42, a protection path is formed between the reference voltage terminal Vss and the power source voltage terminal Vdd. Thus, the semiconductor device can be protected from the third electrostatic breakdown.

In this way, the semiconductor device can be protected from the first, the second and the third electrostatic breakdown by the protection circuit according to the present invention. Since the two P-N junctions in each protection path are supplied with a predetermined voltage Vbb and each P-N junction is reverse biased, the protection path does not affect on the normal operation of the semiconductor device.

Figure 3:
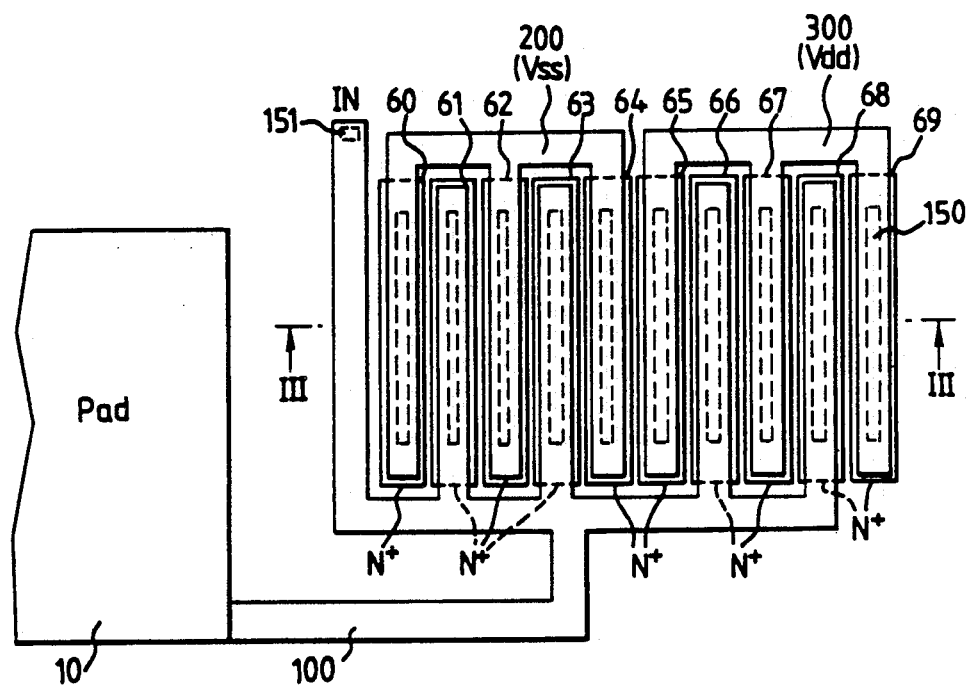
FIG. 3 shows a pattern layout for the protection circuit according to the present invention.

FIG. 3 is a pattern layout for the protection circuit according to one embodiment of the present invention. In this drawing, numeral 10 designates the input terminal. Numerals 60 to 69 designate N-type diffused regions formed in a semiconductor substrate. The wiring 100 connects the input terminal 10 to N-type diffused regions 61, 63, 66 and 68 through a respective contact hole 150, and further connects to an internal circuit (not shown) through a contact hole 151. The second wiring 200 supplied with the reference voltage Vss (e.g., 0 volt) connects N-type regions 60, 62 and 64 together.

The wiring 300 supplied with the power source voltage Vdd connects N-type regions 65, 67 and 69 together. The wiring for supplying the reference voltage Vss to the second wiring 200 and the wiring for supplying the Vdd voltage to the third wiring 300 are omitted for simplicity, but are present in the actual embodiment.

Figure 4:
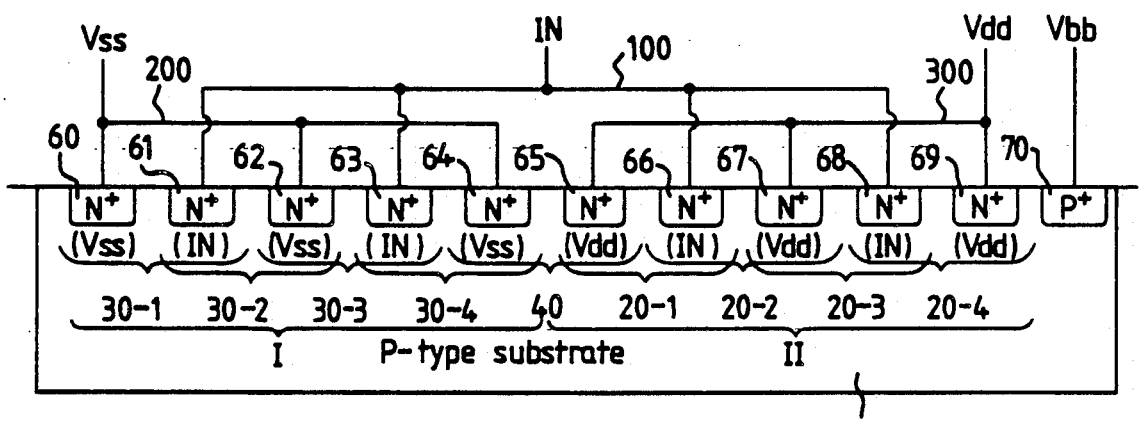
FIG. 4 is a cross sectional view along the line III—III in FIG. 3.

FIG. 4 is a cross sectional view along the line III—III in FIG. 3. As is apparent from FIG. 4, the N-type regions 60 to 69 are divided into two groups I and II. The second wiring 200 connects N-type diffused regions alternately in the first group I, and the third wiring 300 connects N-type regions alternately in the second group II. Thus, a first transistor 30 is composed of four pairs of N-type regions designated by numerals 30-1 to 30-4 cooperating with the substrate 50.

Similarly, the second transistor 20 is composed of four pairs of N-type diffused regions designated by numerals 20-1 to 20-4 cooperating with the substrate 50. Thus, the drivability of the bipolar transistors 20 and 30 are relatively large. The predetermined voltage Vbb (e.g., −2 volt) is supplied to the substrate 50 through a highly doped P-type region 70.

Figure 5:
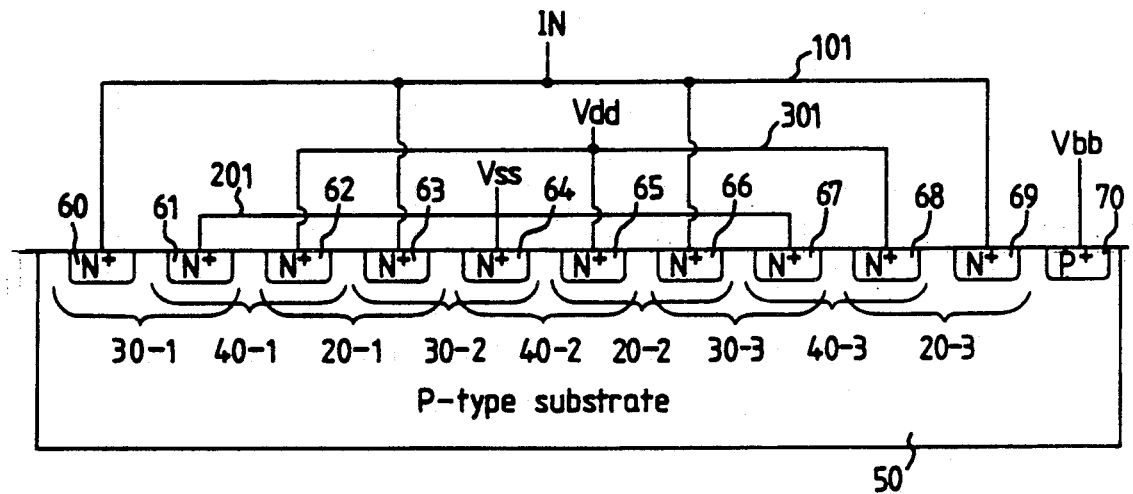
FIG. 5 shows an another embodiment according to the present invention.

FIG. 5 is a cross sectional view of another embodiment according to the present invention. In this embodiment, N-type regions 60, 63, 66 and 69 are connected to the input terminal 10, and N-type regions 61, 64 and 67 are supplied with the reference voltage Vss. Furthermore, N-type regions 62, 65 and 68 are supplied with the power source voltage Vdd.

In this embodiment, the three pairs of N-type regions designated by numerals 40-1 to 40-3 form the third bipolar transistor 40 cooperating with the substrate 50. Thus, the drivability of the third transistor 40 can be increased compared with that of the embodiment in FIG. 4.

Since N-type regions 60 to 69 are formed in one direction with a predetermined space between each one, the formation of the three protection paths including two P-N junctions is easily achieved by connecting the reference voltage terminal Vss, the power source voltage terminal Vdd and the input terminal 10 to the selected diffused regions, as previously explained.

Figure 6:
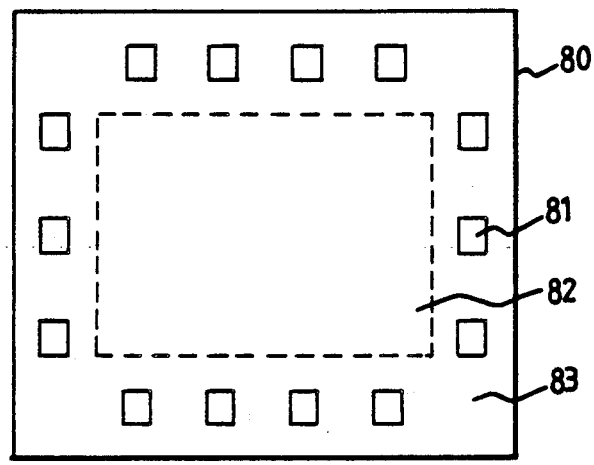
FIG. 6 is a schematic plan view of a semiconductor chip in which a protection circuit according to the present invention may be provided.

FIG. 6 is a schematic plan view of a semiconductor chip 80 in which the protection circuit according to the present invention may be installed. Numeral 81 designates bonding pads used as the input terminals or output terminals, and 82 is an element region wherein an internal circuit is formed. The other region designated by numeral 83 is called "dead space". The protection circuit according to the present invention can be formed in the dead space 83, e.g., between the pads 81. Thus, the element region 82 is not narrowed by the formation of the protection circuit. In other words, the reliability of the semiconductor device can be increased due to the protection circuit without narrowing the element region.

In the aforementioned embodiment, a P-type substrate is used. However, an N-type substrate can be used. In this case, the protection path can be expressed as a PNP-type protection transistor instead of the NPN transistor.

Furthermore, in the aforementioned embodiment, ten diffused regions 60 to 69 are formed for the protection circuit in the substrate. However, the number of the diffused regions can be changed according to the demand. It is possible to form the three protection paths between the three terminals by four diffused regions, at a minimum.

The present invention has been described with respect to specific embodiments. However, other embodiments based on the principles of the present invention should be obvious to those of ordinary skill in the art. Such embodiments are intended to be covered by the claims.

What is claimed is:

1. A protection circuit for a semiconductor device having a first terminal supplied with a reference voltage, a second terminal supplied with a power source voltage and an input terminal connected to an internal circuit, comprising:
a first protection path connected between the input terminal and the first terminal, including a first and a second P-N junction each serially connected to be reverse biased;
a second protection path connected between the input terminal and the second terminal, including a third and a fourth P-N junction each serially connected to be reverse biased; and
a third protection path connected between the first and the second terminals, including a fifth and a sixth P-N junction each serially connected to be reverse biased.

2. The protection circuit of claim 1, wherein each serial connection of the two P-N junctions has a common node supplied with a predetermined voltage, whereby the predetermined voltage reverse biases the respective P-N junctions in the protection path during normal operation of the semiconductor device.

3. A semiconductor device comprising:
a semiconductor substrate of a first conductivity type including an internal circuit formed therein, the substrate being supplied with a predetermined voltage;
an input terminal connected to the internal circuit;
at least four diffused regions of a second conductivity type formed in the substrate;
first wiring means for supplying a first power source voltage at a first terminal to a first selected one of the diffused regions;
second wiring means for supplying a second power source voltage at a second terminal to a second selected one of the diffused regions; and
third wiring means for connecting the input terminal to at least one of the remaining diffuse regions, whereby a protection path including a first and second P-N junction serially connected to be reverse biased is formed between the first terminal and the second terminal, between the second terminal and the input terminal, and between the input terminal and the second terminal.

4. The semiconductor device of claim 3, wherein the diffused regions are formed in a predetermined direction with a predetermined spacing therebetween.

5. The semiconductor device of claim 4, wherein the diffused regions are divided into two groups, with the first wiring means connecting the diffused regions alternately with the third wiring means in the first group, and the second wiring means connecting the diffused regions alternately with the third wiring means in the second group.

6. The semiconductor device of claim 3, wherein the substrate includes an element region and a dead space, and the diffused regions are formed in the dead space.

* * * * *